United States Patent
Kar-Roy et al.

(10) Patent No.: US 7,041,569 B1
(45) Date of Patent: May 9, 2006

(54) METHOD FOR FABRICATING A HIGH DENSITY COMPOSITE MIM CAPACITOR WITH REDUCED VOLTAGE DEPENDENCE IN SEMICONDUCTOR DIES

(75) Inventors: Arjun Kar-Roy, Irvine, CA (US); Marco Racanelli, Santa Ana, CA (US); David Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 207 days.

(21) Appl. No.: 10/712,067

(22) Filed: Nov. 13, 2003

Related U.S. Application Data

(62) Division of application No. 10/410,937, filed on Apr. 9, 2003, now Pat. No. 6,680,521.

(51) Int. Cl.
*H01L 21/20* (2006.01)

(52) U.S. Cl. ...................................................... 438/396

(58) Field of Classification Search ...................... None
See application file for complete search history.

(56) References Cited

U.S. PATENT DOCUMENTS

| | | | |
|---|---|---|---|
| 6,200,629 B1 * | 3/2001 | Sun | 427/79 |
| 6,710,425 B1 * | 3/2004 | Bothra | 257/532 |
| 6,734,489 B1 * | 5/2004 | Morimoto et al. | 257/306 |
| 6,746,914 B1 * | 6/2004 | Kai et al. | 438/253 |
| 6,919,233 B1 * | 7/2005 | Papa Rao et al. | 438/128 |
| 2002/0038903 A1 * | 4/2002 | Tsau | 257/532 |
| 2003/0150384 A1 * | 8/2003 | Baude et al. | 118/721 |
| 2004/0077141 A1 * | 4/2004 | Kim | 438/240 |

* cited by examiner

*Primary Examiner*—David E. Graybill
(74) *Attorney, Agent, or Firm*—Farjami & Farjami LLP

(57) ABSTRACT

According to a disclosed embodiment, a composite MIM capacitor comprises a lower electrode of a lower MIM capacitor situated in a lower interconnect metal layer of a semiconductor die. The composite MIM capacitor further comprises an upper electrode of the lower MIM capacitor situated within a lower interlayer dielectric, where the lower interlayer dielectric separates the lower interconnect metal layer from an upper interconnect metal layer. A lower electrode of the upper MIM capacitor is situated in the upper interconnect metal layer. An upper electrode of the upper MIM capacitor is situated within the upper interlayer dielectric which is, in turn, situated over the upper interconnect metal layer. The upper electrode of the lower MIM capacitor is connected to the lower electrode of the upper MIM capacitor while the lower electrode of the lower MIM capacitor is connected to the upper electrode of the upper MIM capacitor.

9 Claims, 3 Drawing Sheets

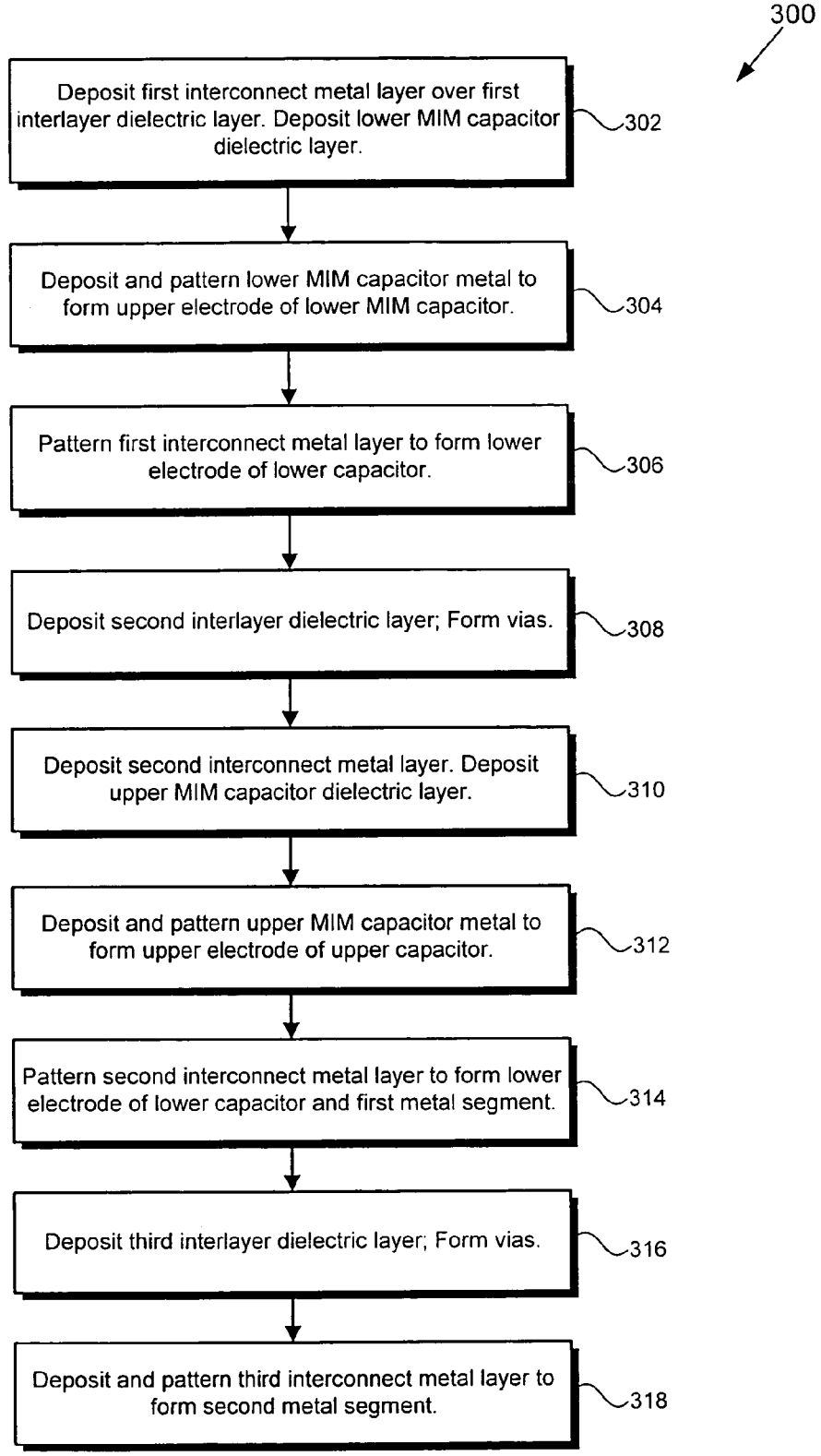

METHOD FOR FABRICATING A HIGH DENSITY COMPOSITE MIM CAPACITOR WITH REDUCED VOLTAGE DEPENDENCE IN SEMICONDUCTOR DIES

This is a divisional of application Ser. No. 10/410,937 filed Apr. 9, 2003 now U.S. Pat. No. 6,680,521.

BACKGROUND OF THE INVENTION

1. Field of the Invention

The present invention is generally in the field of semiconductor fabrication. More specifically, the invention is in the field of fabrication of capacitors in semiconductor dies.

2. Background Art

High performance mixed signal and RF circuits require high density integrated capacitors. Metal-insulator-metal ("MIM") capacitors can be considered for use in the fabrication of integrated mixed signal and RF circuits on semiconductor dies. Disadvantageously, typical MIM capacitors have low capacitance density and since RF and mixed signal applications require high capacitance values, the die area consumed by typical MIM capacitors is too large, resulting in increased die cost to the manufacturer and the user.

The capacitance value of a typical MIM capacitor at an applied voltage can be represented by the following Equation 1:

$$C(V) = C_0(1 + aV + bV^2) \quad \text{(Equation 1)}$$

where $C_0$ is the capacitance value of the capacitor when the voltage across the capacitor electrodes is zero, V is a voltage across the two electrodes of the capacitor, a is a linear voltage coefficient and b is a quadratic voltage coefficient. As shown in Equation 1, the capacitance value at an applied voltage depends on its "voltage coefficients," i.e. its linear and quadratic voltage coefficients. Large voltage coefficients cause an undesirable variation in capacitance. In a conventional MIM capacitor, when the dielectric thickness is reduced to increase capacitance density, the MIM capacitor's voltage coefficients disadvantageously increase. Thus, the undesirable increase in voltage coefficients of a conventional MIM capacitor when reducing dielectric thickness, as well as consumption of significant die area by MIM capacitor plates are significant drawbacks in the use of MIM capacitors in mixed signal and RF applications.

Therefore, a need exists for a high density MIM capacitor for use in mixed signal and RF applications where the MIM capacitor's capacitance value is also less dependent on the voltage applied to the capacitor electrodes.

SUMMARY OF THE INVENTION

The present invention is directed to a high density composite MIM capacitor with reduced voltage dependence in semiconductor dies. The present invention addresses and resolves the need in the art for a high density MIM capacitor for use in mixed signal and RF applications where the MIM capacitor's capacitance value is also less dependent on the voltage applied to the capacitor electrodes.

According to one embodiment of the invention, a composite MIM capacitor comprises a lower electrode of a lower MIM capacitor situated in a lower interconnect metal layer of a semiconductor die. The composite MIM capacitor further comprises an upper electrode of the lower MIM capacitor situated within a lower interlayer dielectric, where the lower interlayer dielectric separates the lower interconnect metal layer from an upper interconnect metal layer. A lower electrode of the upper MIM capacitor is situated in the upper interconnect metal layer. An upper electrode of the upper MIM capacitor is situated within the upper interlayer dielectric which is, in turn, situated over the upper interconnect metal layer.

The upper electrode of the lower MIM capacitor is connected to the lower electrode of the upper MIM capacitor while the lower electrode of the lower MIM capacitor is connected to the upper electrode of the upper MIM capacitor; thus forming an embodiment of the invention's high density composite MIM capacitor with reduced voltage dependence. Other features and advantages of the present invention will become more readily apparent to those of ordinary skill in the art after reviewing the following detailed description and accompanying drawings.

BRIEF DESCRIPTION OF THE DRAWINGS

FIG. 3 shows a flowchart illustrating the steps taken to implement an embodiment of the present invention.

DETAILED DESCRIPTION OF THE INVENTION

The present invention is directed to a high density composite MIM capacitor with reduced voltage dependence in semiconductor dies. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
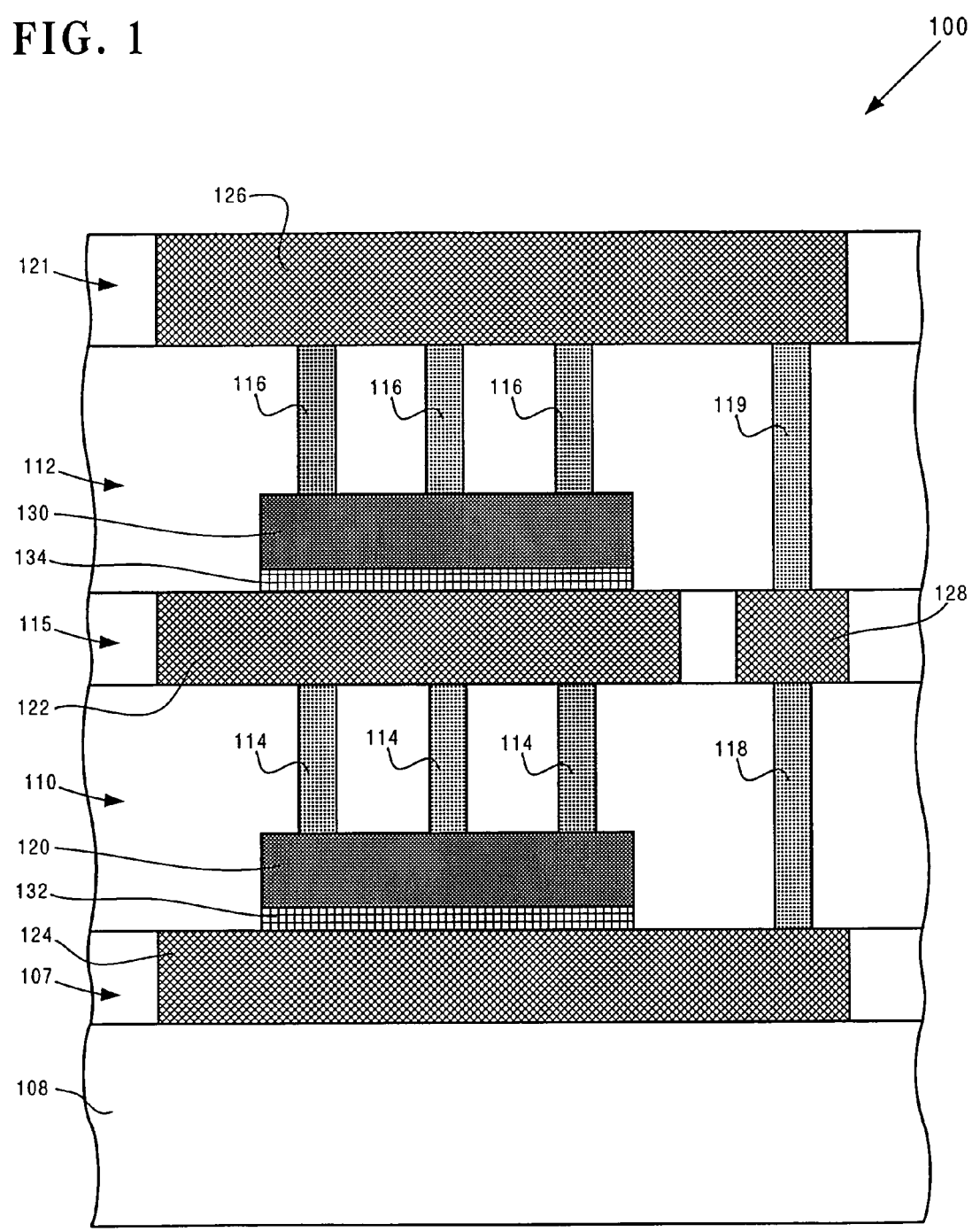
FIG. 1 illustrates a cross-sectional view of an exemplary structure including an exemplary composite MIM capacitor in accordance with one embodiment of the present invention.

FIG. 1 shows a cross-sectional view of a portion of a semiconductor die comprising an exemplary composite MIM capacitor having a lower MIM capacitor connected in parallel with an upper MIM capacitor in accordance with one embodiment of the present invention. As shown in FIG. 1, structure 100 includes metal plate 124, metal plate 120, metal plate 122, and metal plate 130, which form electrodes for two MIM capacitors. In structure 100, metal plate 124 and metal plate 120 form the two electrodes of a "lower" MIM capacitor and metal plate 122 and metal plate 130 form the two electrodes of an "upper" MIM capacitor. It is noted that, for the purpose of the present application, the "lower" MIM capacitor is defined as the MIM capacitor closer to interlayer dielectric 108 (i.e. closer to the substrate surface which is not shown) while the "upper" MIM capacitor is defined as the MIM capacitor further from interlayer dielectric 108 (i.e. further from the substrate surface which is not shown).

Also shown in FIG. 1, metal plate 124 is situated on interlayer dielectric 108 in interconnect metal layer 107 and it (i.e. metal plate 124) can comprise aluminum, copper, or other suitable metal. Metal plate 124 can be formed by depositing and patterning a layer of interconnect metal in a manner known in the art. In one embodiment, metal plate 124 is a "metal stack" comprising, for example, stacked layers of titanium nitride, tantalum nitride, titanium, and/or tantalum over a core portion of, for example, aluminum. Moreover, the top layer in the stack may be conditioned in oxygen, nitrogen, or hydrogen chemistries. By way of an example, metal plate 124 can have a thickness of between approximately 0.3 micron and approximately 0.9 micron. In the present embodiment, interconnect metal layer 107 can be a second interconnect metal layer in a semiconductor die. In other embodiments, interconnect metal layer 107 may be a first, third, fourth, or higher interconnect metal layer in a semiconductor die. Metal plate 124 forms a "lower" electrode of a lower MIM capacitor. It is noted that, for the purpose of the present application, the "lower" electrode is defined as the electrode closer to interlayer dielectric 108 (i.e. closer to the substrate surface, which is not shown).

Further shown in FIG. 1, dielectric segment 132 is situated on metal plate 124. In order to increase MIM capacitance, dielectric segment 132 can comprise silicon oxide, silicon nitride, tantalum pentoxide, aluminum oxide, hafnium oxide, zirconium oxide, zirconium aluminum silicate, hafnium silicate, hafnium aluminum silicate or other dielectrics with a relatively high dielectric constant. By way of an example, dielectric segment 132 can have a thickness of between approximately 200.0 Angstroms and approximately 600.0 Angstroms and can be formed by depositing and patterning a layer of high-k dielectric material in a manner known in the art.

Also shown in FIG. 1, metal plate 120 is situated over dielectric segment 132 and can comprise, for example, titanium nitride or tantalum nitride. By way of an example, metal plate 120 can have a thickness of between approximately 1000.0 Angstroms and approximately 3000.0 Angstroms. Metal plate 120 can be formed by depositing and patterning a layer of titanium nitride or tantalum nitride in a manner known in the art. The layer of titanium nitride or tantalum nitride may be deposited using, for example, physical vapor deposition ("PVD") or chemical vapor deposition ("CVD") techniques. Metal plate 120 forms an "upper" electrode of the lower MIM capacitor. It is noted that, for the purpose of the present application, the "upper" electrode is defined as the electrode further from interlayer dielectric 108 (i.e. further from the substrate surface which is not shown). It is also noted that, unlike metal plate 124, metal plate 120 is not formed in an interconnect metal layer. In other words, metal plate 120 is formed within interlayer dielectric 110, where conventionally no metal plate exists As shown in FIG. 1, interlayer dielectric 110 is situated over interconnect metal layer 107. To reduce parasitic interlayer capacitance, interlayer dielectric 110 can comprise a dielectric with a low dielectric constant, i.e. "a low-k dielectric," such as porous silica, fluorinated amorphous carbon, fluoro-polymer, parylene, polyarylene ether, silsesquioxane, fluorinated silicon dioxide, or diamond-like carbon. Alternatively, interlayer dielectric 110 can comprise silicon oxide as known in the art. Interlayer dielectric 110 can be formed in a manner known in the art, for example, by utilizing a CVD process. Interlayer dielectric 110 can have a thickness of between approximately 0.5 micron and approximately 2.0 microns.

Further shown in FIG. 1, vias 114 and 118 are situated in interlayer dielectric 110. In particular, vias 114 are situated over, and are in contact with, metal plate 120 while via 118 is situated over, and are in contact with, metal plate 124. Vias 114 and 118 may be formed by etching interlayer dielectric 110 by a standard via etch process and the vias may be filled by a suitable electrically conducting material, such as tungsten or copper.

Also shown in FIG. 1, metal plate 122 and metal segment 128, respectively, are situated in interconnect metal layer 115 over vias 114 and via 118. In the present embodiment, interconnect metal layer 115 can be a third interconnect metal layer in a semiconductor die. In other embodiments, interconnect metal layer 115 may be a second, fourth, fifth, or higher interconnect metal layer in a semiconductor die. Metal plate 122 and metal segment 128 can comprise aluminum, copper, or other suitable metal. Metal plate 122 and metal segment 128 may be formed by depositing and patterning a layer of interconnect metal in a manner known in the art. In one embodiment, metal plate 122 is a "metal stack" comprising, for example, stacked layers of titanium nitride, tantalum nitride, titanium, and/or tantalum over a core portion of, for example, aluminum. Moreover, the top layer in the stack may be conditioned in oxygen, nitrogen, or hydrogen chemistries. Metal plate 122, i.e. the lower electrode of the upper MIM capacitor, is electrically coupled to metal plate 120, i.e. the upper electrode of the lower MIM capacitor, by vias 114 and metal segment 128 is electrically coupled to metal plate 124, i.e. the lower electrode of the lower MIM capacitor, by via 118. Metal plate 124, in addition to being the lower electrode of the lower MIM capacitor, can also serve as one terminal of the composite MIM capacitor as discussed in more detail below.

Further shown in FIG. 1, dielectric segment 134 is situated on metal plate 122 and it (i.e. dielectric segment 134) can be substantially similar in composition, thickness and formation to dielectric segment 132. Also shown in FIG. 1, metal plate 130 is situated over dielectric segment 134 and it (i.e. metal plate 130) can be substantially similar in composition, thickness and formation to metal plate 120. Metal plate 130 forms an upper electrode of the upper MIM capacitor. Advantageously, metal plate 130 is formed within interlayer dielectric 112, where conventionally no metal plate exists.

Further shown in FIG. 1, interlayer dielectric 112 is situated over interconnect metal layer 115 and it (i.e. interlayer dielectric 112) is substantially similar in composition, thickness and formation to interlayer dielectric 110. Also shown in FIG. 1, vias 116 and via 119 are situated in interlayer dielectric 112. In particular, vias 116 are situated over, and are in contact with, metal plate 130 and via 119 is situated over, and is in contact with, metal segment 128. Vias 116 and 119 are substantially similar in composition and formation to vias 114 and 118.

Further shown in FIG. 1, metal segment 126 is situated in interconnect metal layer 121 over vias 116 and via 119. In the present embodiment, interconnect metal layer 121 can be a fourth interconnect metal layer in a semiconductor die. In other embodiments, interconnect metal layer 121 may be a third, fifth, sixth, or higher interconnect metal layer in a semiconductor die. Metal segment 126 can comprise aluminum, copper, or other suitable metal and may be formed by depositing and patterning a layer of interconnect metal in a manner known in the art. Metal segment 126 is electrically connected to metal plate 130, i.e. the upper electrode of the upper MIM capacitor, by vias 116 and is electrically connected to metal segment 128, i.e. one terminal of the composite MIM capacitor, by via 119. Thus, metal plate 130, i.e. the upper electrode of the upper MIM capacitor, is electrically connected to metal plate 124, the lower electrode of the lower MIM capacitor, through vias 116, metal segment 126, via 119, metal segment 128, and via 118. In other embodiments, one or more MIM capacitors can be formed above interconnect metal layer 121 and appropriately coupled to MIM capacitors formed below interconnect metal layer 121.

As discussed above, the lower electrode of the lower MIM capacitor, i.e. metal plate 124, is electrically connected to the upper electrode of the upper MIM capacitor, i.e. metal plate 130, and the upper electrode of the lower MIM capacitor, i.e. metal plate 120, is electrically connected to the lower electrode of the upper MIM capacitor, i.e. metal plate 122. Thus, the lower MIM capacitor is coupled in parallel with the upper MIM capacitor to form a composite MIM capacitor where metal plate 122, which is electrically connected to metal plate 120, can serve as a first terminal of the composite MIM capacitor. Similarly, metal segment 128, which is electrically connected to metal plates 124 and 130, can serve as a second terminal of the composite MIM capacitor. Alternatively, either metal plate 124 itself or metal segment 126, which is electrically connected to metal plates 124 and 130, can serve as the second terminal of the composite MIM capacitor.

Thus, by forming the composite MIM capacitor from a parallel combination of the upper and lower MIM capacitors, and by building both the upper and lower MIM capacitors perpendicular to the surface of the die, the present invention achieves a composite MIM capacitor having a capacitance value that is advantageously increased by utilizing the space amply available between interconnect metal layers.

Therefore, as described above, the present invention advantageously achieves a composite MIM capacitor having significantly improved density compared to an MIM capacitor using only lateral space of the die. The present invention further advantageously achieves a composite MIM capacitor having a capacitance value with reduced voltage dependence, which is discussed in detail below.

Figure 2:
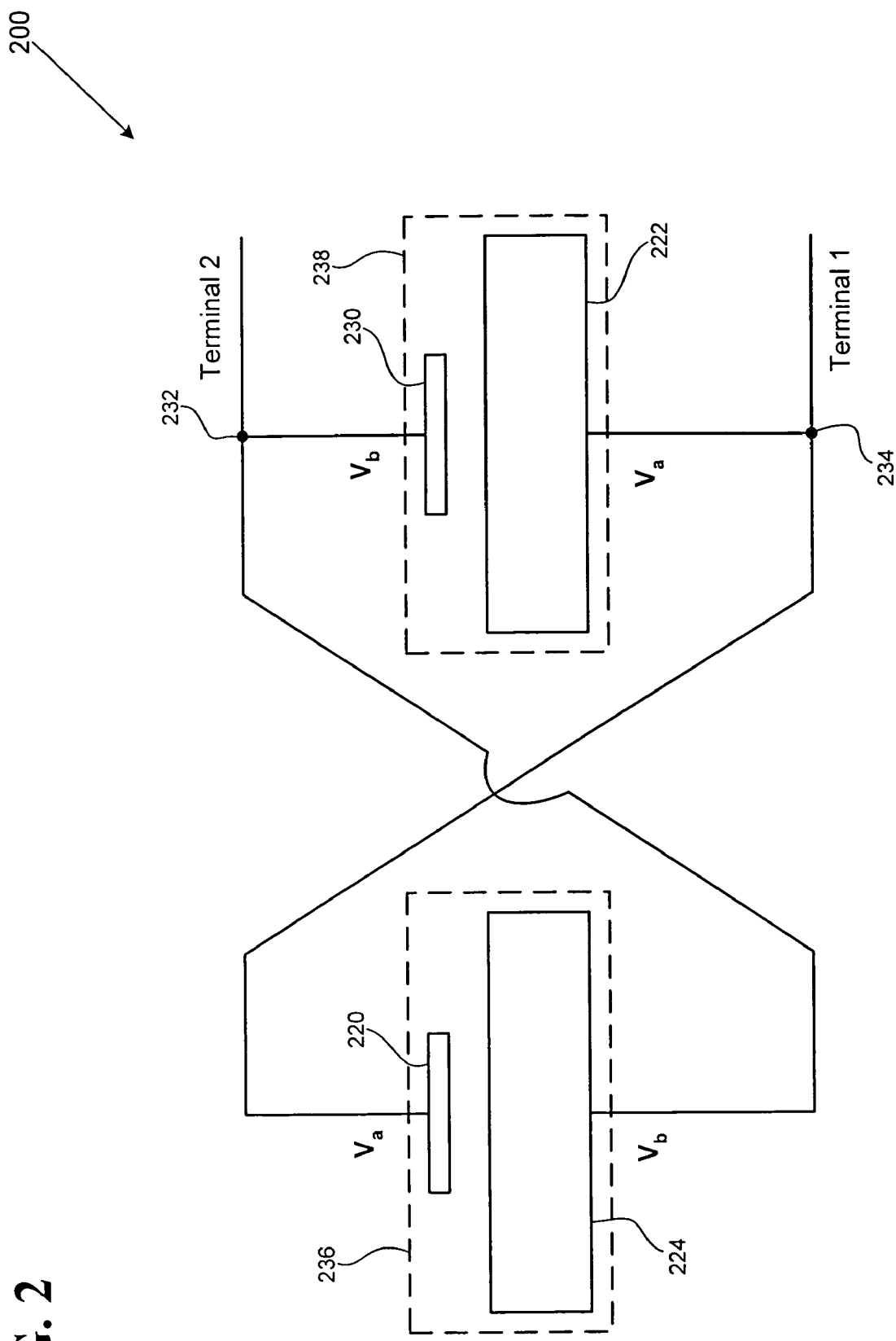
FIG. 2 illustrates a schematic diagram of the exemplary composite MIM capacitor of FIG. 1 in accordance with one embodiment of the present invention.

FIG. 2 shows a schematic diagram corresponding to the exemplary composite MIM capacitor in structure 100 of FIG. 1. As shown in FIG. 2, diagram 200 includes MIM capacitor 236 and MIM capacitor 238 configured in parallel. MIM capacitor 236 includes upper electrode 220 and lower electrode 224, which are analogous to metal plate 120 and metal plate 124, respectively, of structure 100 of FIG. 1. MIM capacitor 238 includes upper electrode 230 and lower electrode 222, which are analogous to metal plate 130 and metal plate 122, respectively, of structure 100 of FIG. 1.

Upper electrode 220 of MIM capacitor 236 is electrically coupled to lower electrode 222 of MIM capacitor 238 at node 234 to form a first terminal of a composite MIM capacitor. Similarly, lower electrode 224 of MIM capacitor 236 is electrically coupled to upper electrode 230 of MIM capacitor 238 at node 232 to form a second terminal of the composite MIM capacitor. If, for example, voltage "$V_a$" is applied to upper electrode 220 of MIM capacitor 236, voltage "$V_a$" is also applied to lower electrode 222 of MIM capacitor 238. Similarly, if voltage "$V_b$" is applied to lower electrode 224 of MIM capacitor 236, voltage "$V_b$" is also applied to upper electrode 230 of MIM capacitor 238. As a result, in the above example, the voltage across MIM capacitor 236 is "$(V_a-V_b)$" and the voltage across MIM capacitor 238 is "$(V_b-V_a)$." Thus, the voltages across MIM capacitors 236 and 238 are equal in value but opposite in polarity.

As discussed above, the capacitance value of an MIM capacitor, such as MIM capacitor 236 in FIG. 2, can be determined by the equation:

$$C(V)=C_0(1+aV+bV^2) \qquad \text{Equation (1)}$$

where "$C_0$" is capacitance value of the capacitor when the voltage across the capacitor electrodes is zero, "V" is the voltage applied across the capacitor electrodes, "a" is a linear coefficient, "b" is a quadratic coefficient, and "C(V)" is the capacitance value of the capacitor when voltage "V" is applied across the capacitor electrodes.

By coupling two capacitors, such as MIM capacitors 236 and 238 in FIG. 2, in a parallel configuration as described above, the voltage across each capacitor is equal in value and opposite in polarity. Thus, the total capacitance of two capacitors, such as MIM capacitors 236 and 238, at a voltage "V" can be determined by:

$$C_T(V)=C_1(1+aV+bV^2)+C_2(1-aV+bV^2) \qquad \text{Equation (2)}.$$

To simplify the meaning of the above equation, it (i.e., equation (2)) can be simplified by assuming that the materials and thickness of such materials utilized to fabricate $C_1$ and $C_2$ are selected such that $C_1$ and $C_2$ have substantially equal capacitance values. In that case, equation (2) may be simplified to form the equation:

$$C_T(V)=2C_0(1+bV^2) \qquad \text{Equation (3)}$$

Thus, by fabricating $C_1$ and $C_2$ such that $C_1$ and $C_2$ have substantially equal capacitance values, the linear coefficient term "$C_1 aV - C_2 aV$" in equation (2) can be virtually eliminated. As a result, the present invention advantageously achieves a composite MIM capacitor, i.e. $C_1$ coupled in parallel with $C_2$, having a total capacitance value that has a significantly reduced dependence on voltage.

In other embodiments of the present invention, where a number greater than two MIM capacitors having substantially equal capacitance values are coupled in parallel, the amount of reduction in voltage dependence of the total capacitance of the parallel-coupled MIM capacitors is determined by whether the number of parallel-coupled MIM capacitors is even or odd. In an embodiment comprising an even number of parallel-coupled MIM capacitors, where the even number of parallel-coupled MIM capacitors are fabricated such that each MIM capacitor has a substantially equal capacitance value, the total capacitance value of the parallel-coupled MIM capacitors at an applied voltage "V" can be determined by the equation:

$$C_{Teven}(V)=nC_0(1+bV^2) \qquad \text{Equation (4)}$$

where "n" is an even number representing the number of parallel-coupled MIM capacitors.

In an embodiment of the present invention comprising an odd number of parallel-coupled MIM capacitors, where the odd number of MIM capacitors are fabricated such that each MIM capacitor has a substantially equal capacitance value, the total capacitance value of the parallel-coupled MIM capacitors at an applied voltage "V" can be determined by the equation:

$$C_{Todd}(V) = mC_0\left(1 + \left(\frac{a}{m}\right)V + bV^2\right) \qquad \text{Equation (5)}$$

where m is an odd number representing the number of parallel-coupled MIM capacitors. Thus, as shown by equations (4) and (5), the present invention achieves a composite MIM capacitor achieving a significant reduction in voltage dependence of capacitance by coupling either an even number of MIM capacitors in parallel or an odd number of MIM capacitors in parallel. However, the reduction of voltage dependence is greater in embodiments utilizing an even number of parallel-coupled MIM capacitors.

FIG. 3 shows flowchart 300, which describes the steps, according to one embodiment of the present invention, of a process by which the composite MIM capacitor in structure 100 in FIG. 1 is fabricated. Certain details and features have been left out of flowchart 300 that are apparent to a person of ordinary skill in the art. For example, a step may consist of one or more substeps or may involve specialized equipment or materials, as known in the art. Steps 302 through 318 indicated in flowchart 300 are sufficient to describe one embodiment of the present invention, other embodiments of the invention may utilize steps different from those shown in flowchart 300. It is noted that the processing steps shown in flowchart 300 are performed on a wafer, which, prior to step 302, includes a first interlayer dielectric layer, e.g. interlayer dielectric 108 shown in FIG. 1.

At step 302 in flowchart 300, a first interconnect metal layer is deposited over the first interlayer dielectric layer, i.e. interlayer dielectric 108. The first interconnect metal layer, i.e. interconnect metal layer 107, for example, can be in interconnect metal layer two of a semiconductor die. A lower MIM capacitor dielectric layer comprising a relatively high-k dielectric material such as silicon oxide, silicon nitride, tantalum pentoxide, aluminum oxide, hafnium oxide, zirconium oxide, zirconium aluminum silicate, hafnium silicate, hafnium aluminum silicate is deposited over the first interconnect metal layer. At step 304, a lower MIM capacitor metal comprising, for example, titanium nitride or tantalum nitride is deposited and patterned over the lower MIM capacitor dielectric layer to form an upper electrode of a lower MIM capacitor, i.e. metal plate 120. The lower MIM capacitor dielectric layer is also patterned to form dielectric segment 132.

At step 306, the first interconnect metal layer is patterned to form a lower electrode of the lower MIM capacitor, i.e. metal plate 124. At step 308, a second interlayer dielectric layer, i.e. interlayer dielectric 110, is deposited over the upper and lower electrodes of the lower MIM capacitor, i.e. metal plates 120 and 124, respectively. The second interlayer dielectric layer can comprise porous silica, fluorinated amorphous carbon, fluoro-polymer, parylene, polyarylene ether, silsesquioxane, fluorinated silicon dioxide, diamond-like carbon, or other appropriate low-k dielectric material. Alternatively, interlayer dielectric 110 can comprise silicon oxide as known in the art. Vias 114 are formed in the second interlayer dielectric layer, i.e. interlayer dielectric 110, over, and in contact with, the upper electrode of the lower MIM capacitor, i.e. metal plate 120. Via 118 is formed in the second interlayer dielectric layer, i.e. interlayer dielectric 110, over, and in contact with, the lower electrode of the lower MIM capacitor, i.e. metal plate 124. Vias 114 and via 118 may be formed by etching the second interlayer dielectric layer by a standard via etch process and can be filled with an electrically conductive material such as tungsten or copper, for example.

At step 310, a second interconnect metal layer, i.e. interconnect metal layer 115, is deposited over the second interlayer dielectric layer and an upper MIM capacitor dielectric layer is deposited over the second interconnect metal layer. The second interconnect metal layer can comprise aluminum, for example, and the upper MIM capacitor dielectric layer can comprise silicon oxide, silicon nitride, tantalum pentoxide, aluminum oxide, hafnium oxide, zirconium oxide, zirconium aluminum silicate, hafnium silicate, hafnium aluminum silicate, or other relatively high-k dielectric material, for example. The second interconnect metal layer can be in interconnect metal layer three of a semiconductor die, for example. At step 312, an upper-MIM capacitor metal layer comprising, for example, titanium nitride or tantalum nitride is deposited and patterned over the upper MIM capacitor dielectric layer to form an upper electrode of an upper MIM capacitor, i.e. metal plate 130. The upper MIM capacitor dielectric layer is also patterned to form dielectric segment 134.

At step 314, the second interconnect metal layer is patterned to form metal segment 128 and a lower electrode of the upper MIM capacitor, i.e. metal plate 122. The lower electrode of the upper MIM capacitor, i.e. metal plate 122, is electrically connected to the upper electrode of the lower MIM capacitor, i.e. metal plate 120, by vias 114. Metal segment 128 is electrically connected to the lower electrode of the lower MIM capacitor, i.e. metal plate 124, by via 118.

At step 316, a third interlayer dielectric layer, i.e. interlayer dielectric 112, is deposited over metal plate 130, metal plate 122 and metal segment 128. The third interlayer dielectric layer can comprise porous silica, fluorinated amorphous carbon, fluoro-polymer, parylene, polyarylene ether, silsesquioxane, fluorinated silicon dioxide, diamond-like carbon, or other low-k dielectric material. Vias 116 are then formed in the third interlayer dielectric layer over, and in contact with, the upper electrode of the upper MIM capacitor, i.e. metal plate 130, and via 119 is formed in the third interlayer dielectric layer over, and in contact with, metal segment 128. Vias 116 and via 119 may be formed by etching the third interlayer dielectric layer by a standard via etch process and can be filled with an electrically conductive material such as tungsten or copper, for example.

At step 318, a third interconnect metal layer, i.e. interconnect metal layer 121, is deposited and patterned over the third interlayer dielectric layer, i.e. interlayer dielectric 112, to form metal segment 126. The third interconnect metal layer can be in interconnect metal layer four of a semiconductor die, for example. Metal segment 126 is formed over, and in contact with, vias 116 and via 119. Thus, metal segment 126 electrically connects the upper electrode of the upper MIM capacitor, i.e. metal plate 130, to the lower electrode of the lower MIM capacitor, i.e. metal plate 124, through vias 116, via 119, metal segment 128, and via 118. As a result of the exemplary process described in flowchart 300, a composite MIM capacitor is formed by the lower MIM capacitor coupled in parallel with the upper MIM capacitor and situated perpendicular to the surface of the die.

Thus, as described above, the present invention advantageously achieves a composite MIM capacitor having significantly improved density when compared to an MIM capacitor using only lateral space of the die. The present invention further advantageously achieves a composite MIM capacitor having a capacitance value with reduced voltage dependence as explained above. From the above description of exemplary embodiments of the invention it is manifest that various techniques can be used for implementing the concepts of the present invention without departing from its scope. For example, metal plate 120 and metal plate 130 can have the same "footprint" or dimensions, which allows a common mask to be used to fabricate both metal plate 120 and metal plate 130, to reduce mask making costs.

Moreover, while the invention has been described with specific reference to certain embodiments, a person of ordinary skill in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a high density composite MIM capacitor with reduced voltage dependence in semiconductor dies has been described.

The invention claimed is:

1. A method for fabricating a composite capacitor in a semiconductor die, said method comprising steps of:
    depositing a lower interconnect metal layer;
    forming an upper electrode of a lower capacitor over said lower interconnect metal layer;
    patterning said lower interconnect metal layer to form a lower electrode of said lower capacitor;
    depositing an interlayer dielectric layer over said upper electrode and said lower electrode of said lower capacitor;
    depositing an upper interconnect metal layer over said interlayer dielectric layer;
    forming an upper electrode of an upper capacitor over said upper interconnect metal layer;
    patterning said upper interconnect metal layer to form a lower electrode of said upper capacitor;
    wherein said lower electrode of said lower capacitor is electrically connected to said upper electrode of said upper capacitor so as to couple said lower capacitor and said upper capacitor in a parallel configuration.

2. The method of claim 1 further comprising a step of connecting said upper electrode of said lower capacitor to said lower electrode of said upper capacitor by at least one via.

3. The method of claim 1 further comprising a step of connecting said lower electrode of said lower capacitor to said upper electrode of said upper capacitor by at least one via.

4. The method of claim 1 further comprising a step of forming a high-k dielectric between said lower and upper electrodes of said lower capacitor.

5. The method of claim 4 wherein said high-k dielectric is selected from the group consisting of silicon oxide, silicon nitride, tantalum pentoxide, aluminum oxide, hafnium oxide, zirconium oxide, zirconium aluminum silicate, hafnium silicate, and hafnium aluminum silicate.

6. The method of claim 1 further comprising a step of forming a high-k dielectric between said lower and upper electrodes of said upper capacitor.

7. The method of claim 6 wherein said high-k dielectric is selected from the group consisting of silicon oxide, silicon nitride, tantalum pentoxide, aluminum oxide, hafnium oxide, zirconium oxide, zirconium aluminum silicate, hafnium silicate, and hafnium aluminum silicate.

8. The method of claim 1 wherein said upper electrode of said lower capacitor and said upper electrode of said upper capacitor comprise metal selected from the group consisting of titanium nitride and tantalum nitride.

9. The method of claim 1 wherein said upper electrode of said lower capacitor and said upper electrode of said upper capacitor are fabricated utilizing a common mask.

* * * * *